(12) United States Patent
Kang et al.

(10) Patent No.: US 7,579,656 B2
(45) Date of Patent: Aug. 25, 2009

(54) TRANSISTOR STRUCTURE FOR SEMICONDUCTOR DEVICE AND METHOD OF FABRICATING THE SAME

(75) Inventors: Tae-Woong Kang, Suwon-si (KR); Hae-Wang Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 11/526,702

(22) Filed: Sep. 26, 2006

(65) Prior Publication Data
US 2007/0072366 A1    Mar. 29, 2007

(30) Foreign Application Priority Data
Sep. 26, 2005   (KR)   .................. 10-2005-0089363

(51) Int. Cl.
*H01L 29/06* (2006.01)
*H01L 29/41* (2006.01)

(52) U.S. Cl. ............... 257/353; 257/330; 257/E29.112; 257/E29.26

(58) Field of Classification Search .......... 257/330, 257/332, 353, E29.112, E29.26
See application file for complete search history.

(56) References Cited

U.S. PATENT DOCUMENTS 6,031,261 A * 2/2000 Kang ................... 257/302
6,436,765 B1 * 8/2002 Liou et al. ............ 438/259
6,475,890 B1   11/2002 Yu
6,509,234 B1 * 1/2003 Krivokapic ........... 438/270
7,285,466 B2  10/2007 Kim et al.
2005/0040444 A1  2/2005 Cohen
2005/0040462 A1 * 2/2005 Koh ..................... 257/344
2006/0183286 A1 * 8/2006 Lee ..................... 438/270
2008/0251857 A1 * 10/2008 Brown .................. 257/382

FOREIGN PATENT DOCUMENTS

| JP | 06-209109 | 7/1994 |
| KR | 10-2005-0015975 A | 2/2005 |
| KR | 10-2005-0020625 | 3/2005 |
| KR | 10-2005-0035712 | 4/2005 |

* cited by examiner

*Primary Examiner*—Charles D. Garber
*Assistant Examiner*—Stanetta D Isaac
(74) *Attorney, Agent, or Firm*—Lee & Morse, P.C.

(57) ABSTRACT

A transistor for a semiconductor device may include a lower semiconductor layer, an active pattern, including a groove region, on the lower semiconductor layer, a gate pattern at least partially overlapping the active pattern including the groove region, and a gate insulating layer interposed between the active pattern and the gate pattern, wherein a bottom surface of the groove region may be lower than a top surface of the active pattern and higher than a lower surface of the active pattern.

6 Claims, 22 Drawing Sheets

TRANSISTOR STRUCTURE FOR SEMICONDUCTOR DEVICE AND METHOD OF FABRICATING THE SAME

BACKGROUND OF THE INVENTION

1. Field of the Invention

The invention relates to a semiconductor device and a method of fabricating the same. More particularly, the invention relates to a transistor structure for a semiconductor device and a method of fabricating the same.

2. Description of the Related Art

Generally, most electronic appliances include semiconductor devices. A semiconductor device may include electronic elements, e.g., a transistor, a resistor, and a capacitor, which may be designed to perform partial functions of the electronic appliance and may be integrated on a semiconductor substrate. For example, some electronic appliances, such as a computer or a digital camera, may include semiconductor devices, e.g., memory chips for storing data and processing chips for controlling data, and the memory chips and processing chips may each include electronic elements integrated on a semiconductor substrate.

To help meet customers' demands for better performance and lower prices, semiconductor devices are becoming more and more highly integrated. According to Moore's law or Hwang's law, the integration density of semiconductor devices has doubled at intervals of 18 months or one year, respectively, and it is expected that semiconductor devices will become more highly integrated in the future. This increase in the integration density of the semiconductor devices can be accomplished by shrinking the planar areas of electronic devices of the semiconductor devices. However, the respective electronic devices should satisfy various characteristics required for the normal operations of the semiconductor devices. This technical demand makes it difficult to shrink the planar areas of the electronic devices.

A short channel effect, which may occur, e.g., in MOS transistors, is a typical example of technical restrictions that preclude shrinking areas of semiconductor devices. The short channel effect may occur when a channel length, i.e., a distance between a source electrode and a drain electrode, of a transistor is decreased, and the short channel effect may degrade the characteristics of a transistor. For example, the short channel effect may give rise to, e.g., punch-through, drain induced barrier lowering (DIBL), subthreshold swing, a gain in parasitic capacitance and/or a rise in leakage current between the source and drain electrodes and a substrate. Such problems impose a technical limitation on reducing the channel length of transistors.

For a semiconductor device including a planar MOS transistor, reducing a channel width W of the transistor may be considered as another method for increasing the integration density of the semiconductor device. However, as expressed in following Equation 1, because a drain current $I_d$ may be proportional to the channel width W, a reduction in the channel width W may bring about a drop in current driving capability.

$$I_d = \frac{W}{L} f(V_G, V_T, V_{DS}), \quad (1)$$

where $L$ = channel length

Thus, for a typical planar MOS transistor, attempts at increasing the degree of integration of a device may be difficult to do while maintaining and/or improving characteristics of the transistor.

Attempts for overcoming the technical restrictions of planar MOS transistors have proposed a FIN field effect transistor (FIN-FET) and a multi-channel FET.

FIG. 1A illustrates a perspective view of a conventional FIN-FET, and FIG. 1B illustrates a diagram for explaining problems associated with fabrication of the conventional FIN-FET. Referring to FIG. 1A, the FIN-FET 10 may include a FIN-type active pattern 5, a gate pattern 7 covering a top surface and sidewalls of the active pattern 5 across the active pattern 5, and a gate insulating layer 6 interposed between the gate pattern 7 and the active pattern 5. The FIN-FET 10 may employ the top surface and both sidewalls of the active pattern 5 as a channel region, so a channel width of the transistor can be increased more than that of a planar MOS transistor.

However, referring to FIG. 1B, forming the active pattern 5 may include forming a predetermined preliminary mask pattern 2 and forming a mask pattern 4, using a predetermined recess process, which has a width smaller than the width of the preliminary mask pattern 2. The resultant mask pattern 4 may be used as an etch mask for forming the active pattern 5. In this case, the preliminary mask pattern 2 may be formed to a nonuniform width, as shown in FIG. 1B, and the nonuniform width of the preliminary mask pattern 2 may be transferred to the active pattern 5. Even if a ratio of a variation Δw of the width of the preliminary mask pattern 2 to the entire width $w_1$ of the preliminary mask pattern 2 is small, a ratio of the variation Δw of the width $w_1$ of the preliminary mask pattern 2 to the width $w_2$ of the mask pattern 4 or the width $w_3$ of the active pattern 5 is large. This nonuniform width of the preliminary mask pattern 2 may cause the characteristics of the FIN-FET to be unstable.

FIG. 2A illustrates a cross sectional view of a conventional multi-channel FET, and FIG. 2B illustrates a diagram for explaining problems associated with the conventional multi-channel FET.

To overcome such non-uniformity in the width of the active region of the FIN-FET, the multi-channel FET 20 may be formed to have the structure illustrated in FIGS. 2A and 2B. Forming the multi-channel FET 20 may include forming a mask pattern 24 and forming an active pattern 26. The mask pattern 24 may be formed with a gap region 23 by etching a central portion of a preliminary mask pattern 22. The active pattern may be formed using the mask pattern 24 illustrated in FIG. 2B as an etch mask. Thus, a groove region 27, which may penetrate the active pattern 26, may be formed at a position corresponding the gap region 23, as shown in FIG. 2A. Thereafter, a gate insulating layer 28 may be formed on the surface of the active pattern 26, and a gate pattern 29 may be formed on the gate insulating layer 28 across the groove region 27. Generally, a channel region of transistor is a region where the gate pattern 29 intersects the active pattern 26. Thus, portions of the active patterns 26 bordering the groove region 27 may only be used for the channel region of the multi-channel FET 20.

For this reason, it may be difficult to fabricate transistors with various channel widths using the multi-channel FET 20. That is, because a channel width of the multi-channel FET 20 may be proportional to a number of the active patterns 26 constituting the channel region, the channel width of the multi-channel FET 20 is substantially discrete. In particular, a height of the active pattern 26 may be a process parameter that may affect the characteristics of various transistors. Thus, the height of the active pattern 26 cannot be arbitrarily changed. The fixed height of the active pattern 26 may hinder overcoming the above-described discreteness of the channel width of the multi-channel FET 20.

SUMMARY OF THE INVENTION

The invention is therefore directed to a transistor structure and a method of manufacturing such a transistor structure, which substantially overcome one or more of the problems due to the limitations and disadvantages of the related art.

It is therefore a feature of an embodiment of the invention to provide a transistor structure that minimizes a short channel effect.

It is therefore a separate feature of an embodiment of the invention to provide a transistor structure that maximizes current driving capability.

It is therefore a separate feature of an embodiment of the invention to provide a transistor structure that lowers the degree of current dispersion.

It is therefore a separate feature of an embodiment of the invention to provide a transistor structure that overcomes the technical restrictions of a conventional multi-channel field effect transistor (FET) with a discrete channel width.

It is therefore a separate feature of an embodiment of the invention to provide a method of fabricating a transistor structure that minimizes a short channel effect and maximizes current driving capability.

It is therefore a separate feature of an embodiment of the invention to provide a method of fabricating a transistor structure that lowers the degree of current dispersion.

It is therefore a separate feature of an embodiment of the invention to provide a method of fabricating a transistor structure that overcomes the technical restrictions of a conventional multi-channel field effect transistor (FET) with a discrete channel width.

It is therefore a separate feature of an embodiment of the invention to provide a transistor structure employing a bottom surface of an active region as a channel region.

At least one of the above and other features and advantages of the invention may be realized by providing a transistor for a semiconductor device, including a lower semiconductor layer, an active pattern, including a groove region, on the lower semiconductor layer, a gate pattern at least partially overlapping the active pattern including the groove region, and a gate insulating layer interposed between the active pattern and the gate pattern, wherein a bottom surface of the groove region is lower than a top surface of the active pattern and higher than a lower surface of the active pattern.

The groove region may be formed in a central portion of the active pattern, wherein two sidewalls of the active pattern, which are disposed under the gate pattern and define the groove region, have a same width. The active pattern may include monocrystalline silicon. The transistor may include an insulating layer interposed between the active pattern and the lower semiconductor layer. The gate pattern may partially cover an outer sidewall and the top surface of the active pattern, and may completely covers the bottom surface and an inner side wall of the groove region. A width of a channel region defined by the gate pattern and the active pattern is $W+2(H1+H2)$, wherein W is a width of the active pattern, H1 is a thickness of the active pattern, and H2 is a depth of the groove region.

At least one of the above and other features and advantages of the invention may be realized by providing a method of fabricating a transistor for a semiconductor device, including preparing an SOI (silicon on insulator) substrate including a lower semiconductor layer, a buried oxide layer, and an upper semiconductor layer that are sequentially stacked, forming an active pattern including a groove region by patterning the upper semiconductor layer, forming a gate insulating layer on a surface of the active pattern, and forming a gate pattern on the gate insulating layer, the gate pattern extending across the active pattern over the groove region, wherein a bottom surface of the groove region may be lower than a top surface of the upper semiconductor layer and higher than a top surface of the buried oxide layer.

Forming the active pattern, including the groove region, may include forming a first mask pattern on the upper semiconductor layer, forming a trench defining the active pattern and exposing the top surface of the buried oxide layer by patterning the upper semiconductor layer using the first mask pattern as an etch mask, forming a first sacrificial pattern to fill the trench, forming an opening exposing a portion of a top surface of the active pattern by etching the first sacrificial pattern and the first mask pattern, forming a spacer on an inner wall of the opening, and recessing the exposed top surface of the active pattern using the spacer as an etch mask.

Forming the first sacrificial pattern may include forming a first sacrificial layer filling the trench on the resultant structure including the active pattern, and forming the first sacrificial pattern enclosing the active pattern and the first mask pattern by etching the first sacrificial layer until a top surface of the first mask pattern is exposed. Etching of the first sacrificial layer may be performed through a CMP (chemical mechanical polishing) technique using etch slurry having an etch selectivity with respect to the first mask pattern.

Forming the opening may include forming a second mask pattern on the resultant structure including the first sacrificial pattern, the second mask pattern exposing the first mask pattern over the opening, forming the opening exposing a portion of the top surface of the active pattern by etching the exposed first mask pattern using the second mask pattern as an etch mask; and exposing top surfaces of the first sacrificial pattern and the first mask pattern by removing the second mask pattern, wherein the etching of the first mask pattern may be performed using an etch recipe having an etch selectivity with respect to the first sacrificial pattern.

Forming the opening may include forming a second mask pattern on the resultant structure including the first sacrificial pattern, the second mask pattern may run across the first mask pattern over the opening, etching the first sacrificial pattern and the first mask pattern using the second mask pattern as an etch mask until the top surface of the active pattern is exposed, exposing a top surface of the first mask pattern by removing the second mask pattern, forming a second sacrificial layer on the resultant structure from which the second mask pattern is removed, forming a second sacrificial pattern by planarizing the second sacrificial layer until the top surface of the first mask pattern is exposed, the second sacrificial pattern covering both sidewalls of the first mask pattern over the active pattern, and exposing the top surface of the active pattern by removing the exposed first mask pattern.

Removing the first mask pattern may be performed using an etch recipe having an etch selectivity with respect to the first and second sacrificial patterns. The first sacrificial pattern may be formed of the same material as the second sacrificial pattern. Forming the opening may include forming a second mask pattern on the resultant structure including the first sacrificial pattern, the second mask pattern running across the first mask pattern over the opening, etching the first mask pattern using the second mask pattern as an etch mask until the top surface of the active pattern is exposed, exposing a top surface of the first mask pattern by removing the second mask pattern, forming a second sacrificial layer on the resultant structure from which the second mask pattern is removed, forming a second sacrificial pattern by planarizing the second sacrificial layer until the top surface of the first mask pattern is exposed, the second sacrificial pattern covering both sidewalls of the first mask pattern over the active pattern, and exposing the top surface of the active pattern by removing the exposed first mask pattern.

Removing the first mask pattern may include using an etch recipe having an etch selectivity with respect to the first and second sacrificial patterns. The first sacrificial pattern may be formed of a same material as the second sacrificial pattern. The first mask pattern may be formed of a material having an etch selectivity with respect to the upper semiconductor layer, and the first sacrificial pattern is formed of a material having an etch selectivity with respect to the upper semiconductor layer, the buried oxide layer, and the first mask pattern. The first mask pattern may include at least one of a silicon nitride layer, a silicon oxide layer, a silicon oxynitride layer and a polycrystalline silicon (polysilicon) layer, the first sacrificial pattern includes at least one of a silicon oxide layer, a silicon nitride layer, a silicon oxynitride layer and a polysilicon layer, and one of the first mask pattern and the first sacrificial pattern includes at least one component not included in the other of the first mask pattern and the first sacrificial pattern.

Recessing the exposed top surface of the active pattern may include recessing the exposed top surface of the active pattern to a depth of about 5 nm to about 30 nm.

BRIEF DESCRIPTION OF THE DRAWINGS

The above and other features and advantages of the invention will become more apparent to those of ordinary skill in the art by describing in detail exemplary embodiments thereof with reference to the attached drawings in which:

FIGS. 3A through 11A illustrate plan views of resulting structures formed during stages of an exemplary embodiment of a method of fabricating a transistor of a semiconductor device according to one or more aspects of the invention;

FIGS. 3B through 11B illustrate cross sectional views of the corresponding resulting structures illustrated in FIGS. 3A through 11A, respectively, taken along line I-I' of FIGS. 3A through 11A;

FIGS. 3C through 11C illustrate cross sectional views of the corresponding resulting structures illustrated in FIGS. 3A through 11A, respectively, taken along a line II-II' of FIGS. 3A through 11A;

DETAILED DESCRIPTION

Figure 1A:
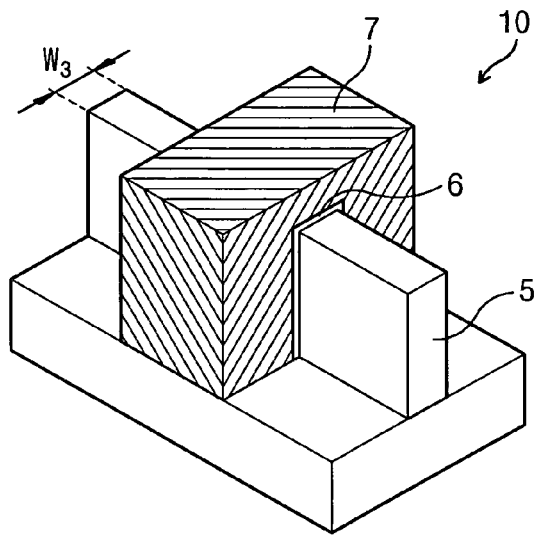
FIG. 1A illustrate a perspective view of a conventional FIN field effect transistor (FIN-FET)
Figure 1B:
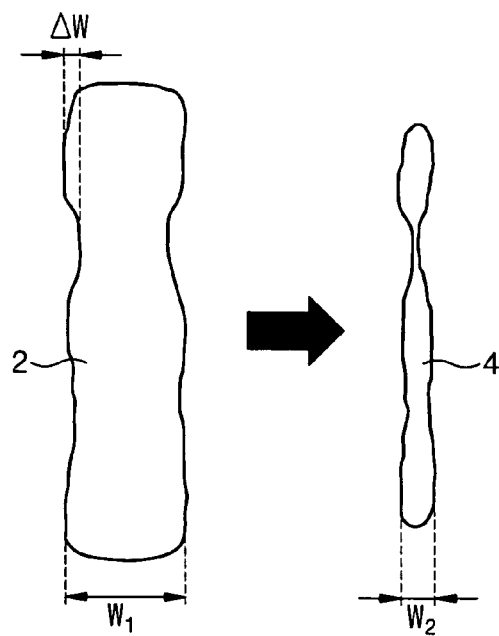
FIG. 1B illustrates a diagram for explaining problems associated with the fabrication of the conventional FIN-FET.
Figure 2A:
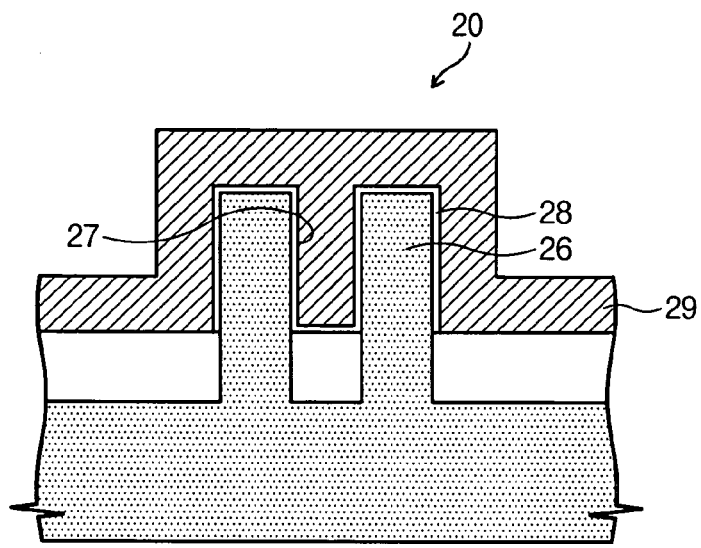
FIG. 2A illustrates a cross sectional view of a conventional multi-channel FET.
Figure 2B:
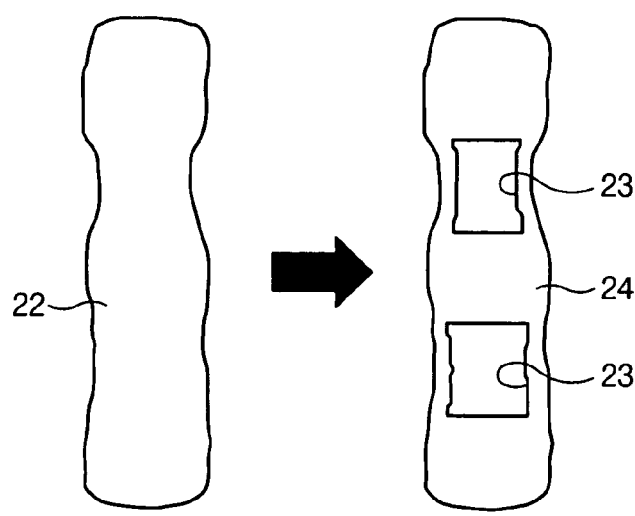
FIG. 2B illustrates a diagram for explaining problems of the conventional multi-channel FET.

Korean Patent Application No. 2005-89363, filed on Sep. 26, 2005, in the Korean Intellectual Property Office, and entitled: "Transistor Structure for Semiconductor Device and Method of Fabricating the Same," is incorporated by reference herein in its entirety.

The invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 3A through 11A illustrate plan of resulting structures formed during stages of an exemplary embodiment of a method of fabricating a transistor of a semiconductor device according to one or more aspects of the invention; FIGS. 3B through 11B illustrate cross sectional views of the resulting structures, respectively, taken along a dotted line I-I' of FIGS. 3A through 11A; and FIGS. 3C through 11C illustrate cross sectional views of the resulting structures, respectively, taken along a dotted line II-II' of FIGS. 3A through 11A.

Figure 3A:
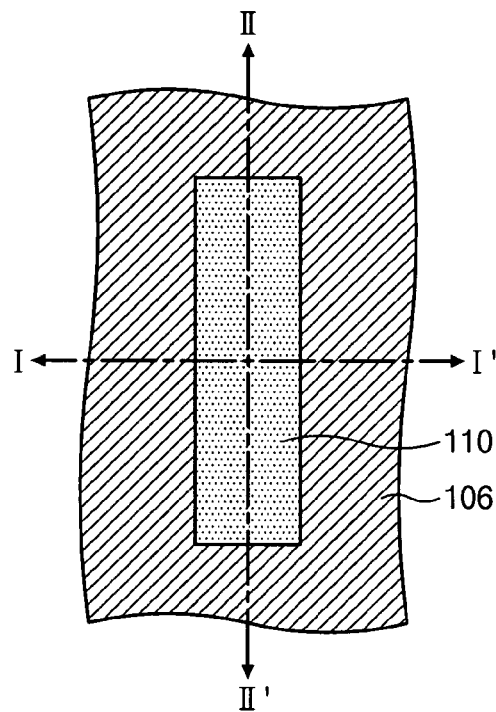
Figure 3B:
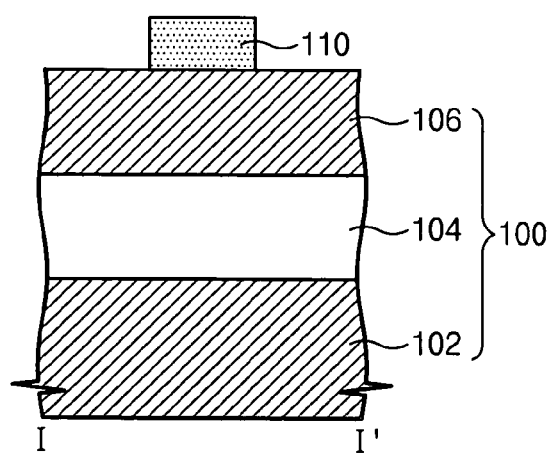
Figure 3C:
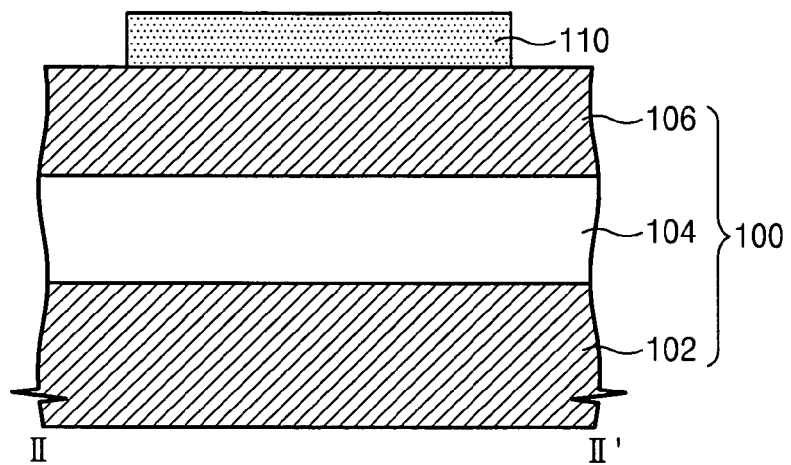

Referring to FIGS. 3A through 3C, a first mask pattern 110 may be formed on a substrate 100 to define an active pattern.

In embodiments of the invention, the substrate 100 may be, e.g., a silicon on insulator (SOI) substrate including a lower semiconductor layer 102, a buried oxide layer 104, and an upper semiconductor layer 106, which may be sequentially stacked. The lower semiconductor layer 102 may be formed of, e.g., monocrystalline silicon. The buried oxide layer 104 may be formed, e.g., of silicon oxide. The upper semiconductor layer 106 may be formed of, e.g., monocrystalline silicon.

The first mask pattern 110 may be formed of a material having an etch selectivity with respect to the upper semiconductor layer 106. In the following description, "a layer A having an etch selectivity with respect to a layer B" means "being capable of etching layer A while minimizing the etching of layer B." In exemplary embodiments, e.g., the first mask pattern 110 may include a silicon oxide layer, a silicon nitride layer, a silicon oxynitride layer, and/or a polycrystalline silicon (polysilicon) layer. In embodiments of the invention, the first mask pattern 110 may include a silicon oxide layer and a silicon nitride layer, which may be sequentially stacked. The first mask pattern 110 may have a bar-like shape, as shown in FIG. 3A. However, it would be apparent that the form of the first mask pattern 110 may be variously changed.

Figure 4A:
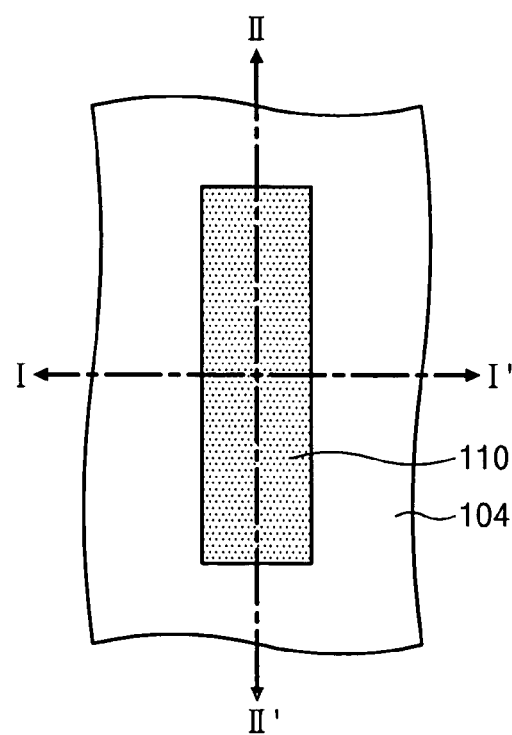
Figure 4B:
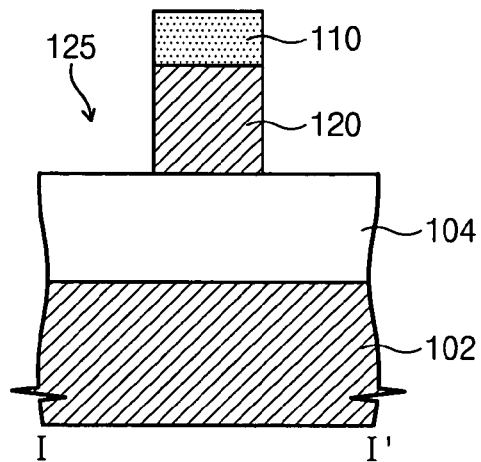
Figure 4C:
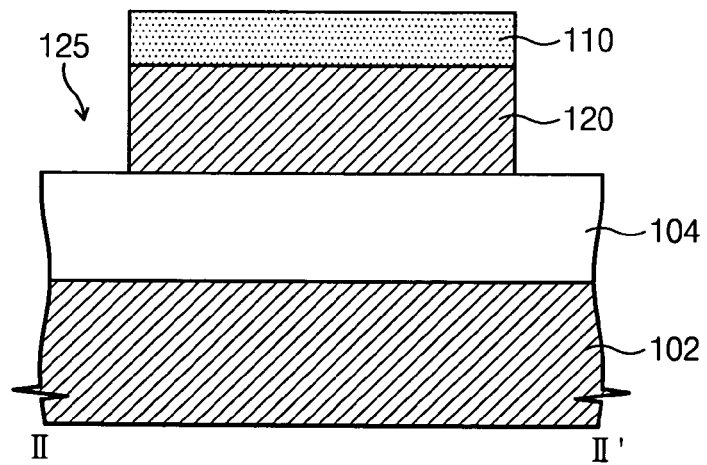

Referring to FIGS. 4A through 4C, the upper semiconductor layer 106 may be patterned using the first mask pattern 110 as an etch mask, thereby forming an active pattern 120 and exposing a portion of the buried oxide layer 104. Forming the active pattern 120 may include anisotropically etching the upper semiconductor layer 106 using an etch recipe having an etch selectivity with respect to the buried oxide layer 104 and the first mask pattern 110. That is, the etch recipe may remove a respective portion(s) of the upper semiconductor layer 106 while removing very little or none of the buried oxide layer 104 and the first mask pattern 110.

Figure 5A:
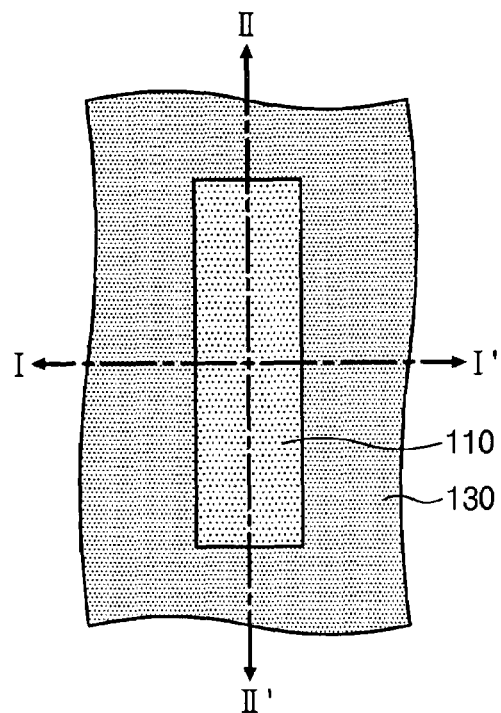
Figure 5B:
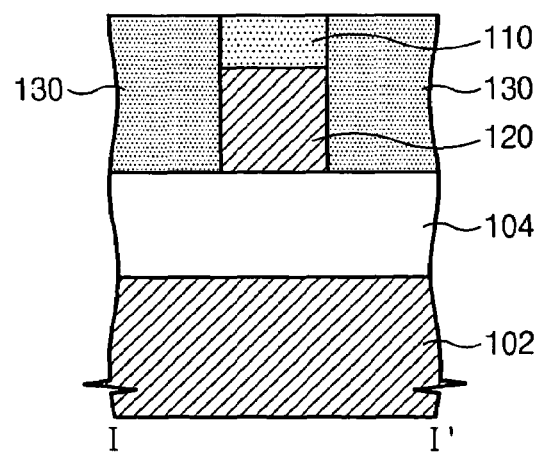
Figure 5C:
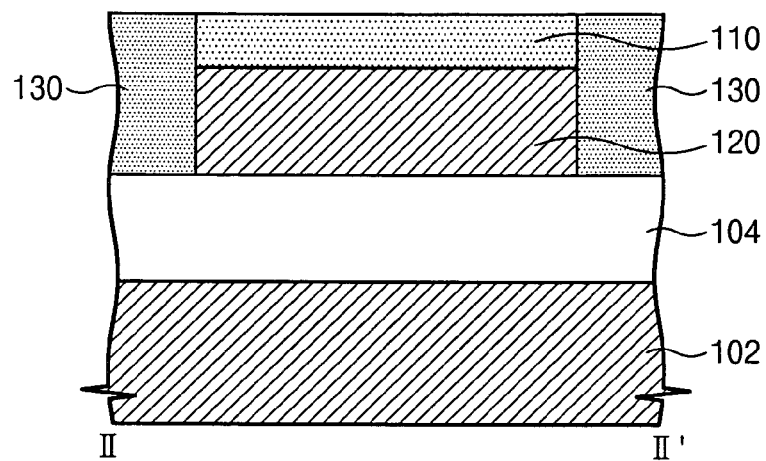

Referring to FIGS. 5A through 5C, a first sacrificial pattern 130 may fill a trench 125 (illustrated in FIG. 4B and 4C) adjacent to the active pattern 120. The first sacrificial pattern 130 may be formed of a material having, e.g., an etch selectivity with respect to the active pattern 120 and the first mask pattern 110. For example, the first sacrificial pattern 130 may include a silicon oxide layer, a silicon nitride layer, a silicon oxynitride layer, and/or a polycrystalline silicon (polysilicon) layer. In embodiments of the invention, the first sacrificial pattern 130 may also have an etch selectivity with respect to the buried oxide layer 104. In such cases, by controlling process parameters, e.g., a concentration of impurities contained in the first sacrificial pattern 130 and/or a temperature at which the first sacrificial pattern 130 is formed, the first sacrificial pattern 130 may have an etch selectivity with respect to the buried oxide layer 104.

Forming the first sacrificial pattern 130 may include forming a first sacrificial layer (not shown) on the resultant structure having the active pattern 120 and planarizing the first sacrificial layer until a top surface of the first mask pattern 110 is exposed. The first sacrificial layer may be planarized by, e.g., a chemical mechanical polishing (CMP) process using etch slurry having an etch selectivity with respect to the first mask pattern 110. As a result of the planarizing, the first sacrificial pattern 130 may have a planar top surface with the first mask pattern 110.

Figure 6A:
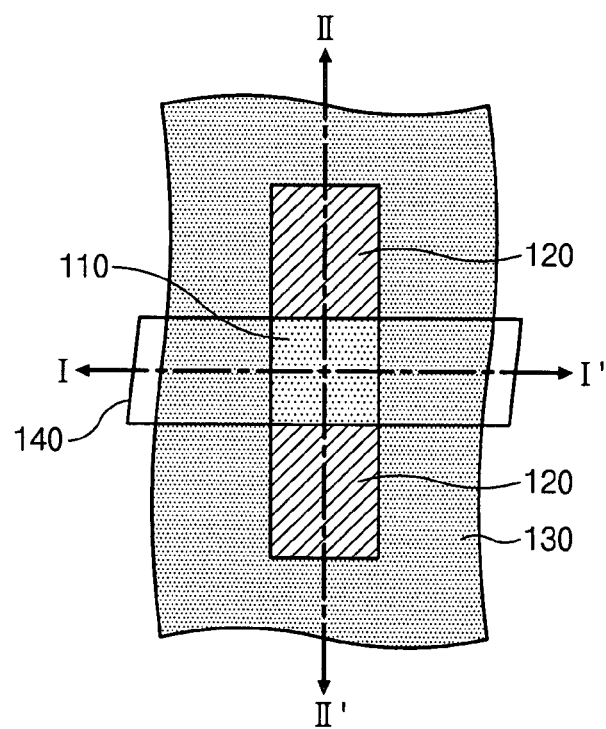
Figure 6B:
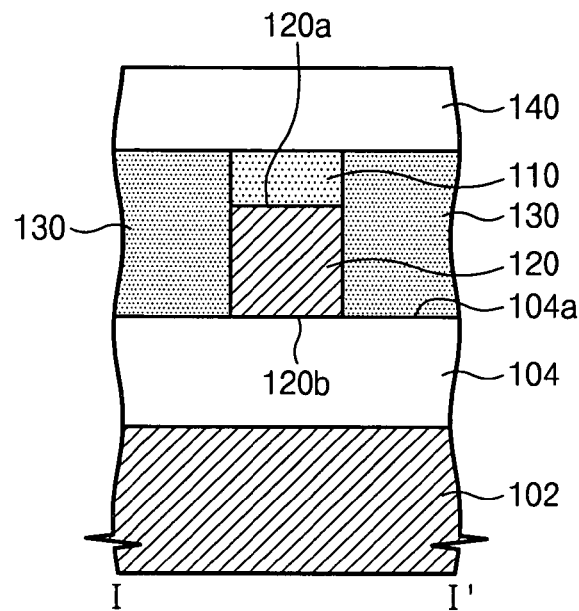
Figure 6C:
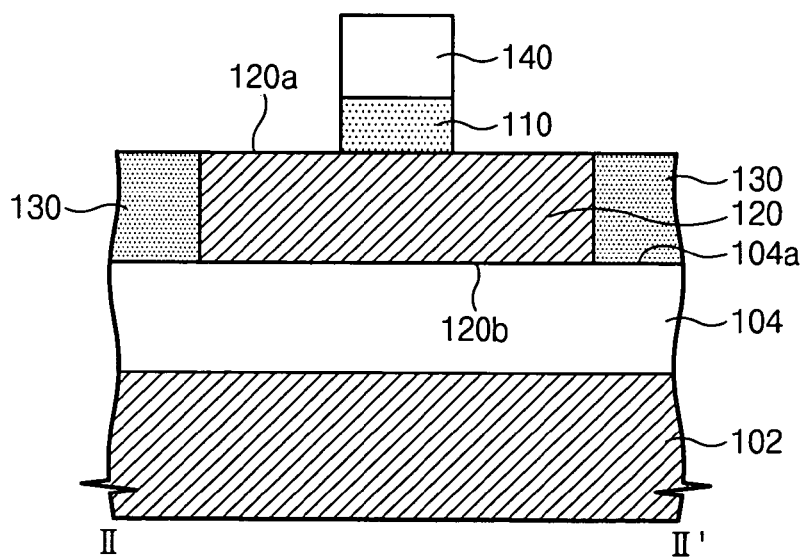

Referring to FIGS. 6A through 6C, a second mask pattern 140 may be formed across the first mask pattern 110 on the resultant structure having the first sacrificial pattern 130. The second mask pattern 140 may be, e.g., a photoresist pattern obtained using a photolithography process and may define a region where a channel region will be formed. Accordingly, in embodiments of the invention, the second mask pattern 140 may be formed using, e.g., a reticle for a gate pattern, which may be used during subsequent processing. Such multiple, e.g., double, use of the reticle, may reduce a fabrication cost of semiconductor devices being formed.

Subsequently, the first mask pattern 110 and the first sacrificial pattern 130 may be etched using the second mask pattern 140 as an etch mask. The first mask pattern 110 and the first sacrificial pattern 130 may be etched until a top surface of the active pattern 120 is exposed. In embodiments of the invention, only a portion of the first mask pattern 110 under the second mask pattern 140 may remain, while a top surface of the first sacrificial pattern 130 and/or a top surface 120a of the active pattern 120 is/are exposed from under the second mask pattern 140. As illustrated in FIG. 6C, only a portion of the top surface 120a of the active pattern 120, which does not overlap the second mask pattern 140, may be exposed. As illustrated in FIGS. 6B and 6C, an upper portion of the first sacrificial pattern 130 that corresponds, e.g., to a height of the first mask pattern 110 may be etched. Thus, the resulting top surface of the first sacrificial pattern may be substantially planar with the top surface 120a of the active pattern 120. Etching of the first mask pattern 110 and the first sacrificial pattern 130 may be performed using an etch recipe having an etch selectivity with respect to the active pattern 120.

Figure 7A:
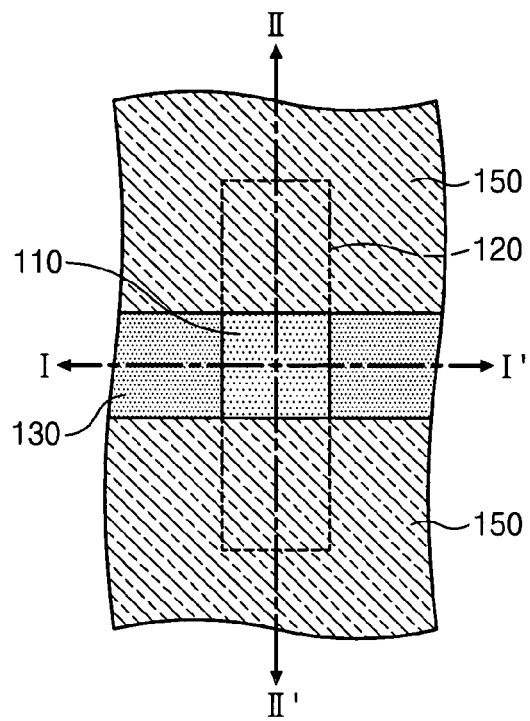
Figure 7B:
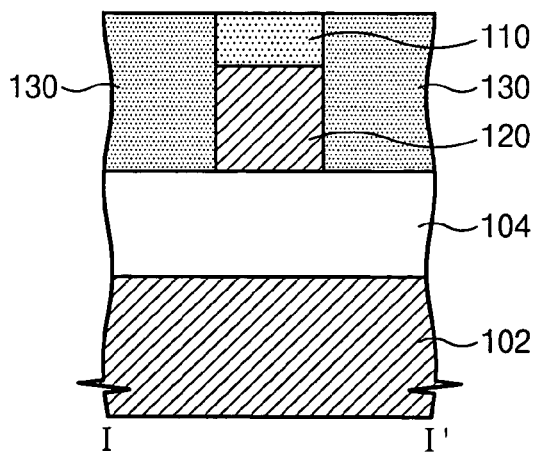
Figure 7C:
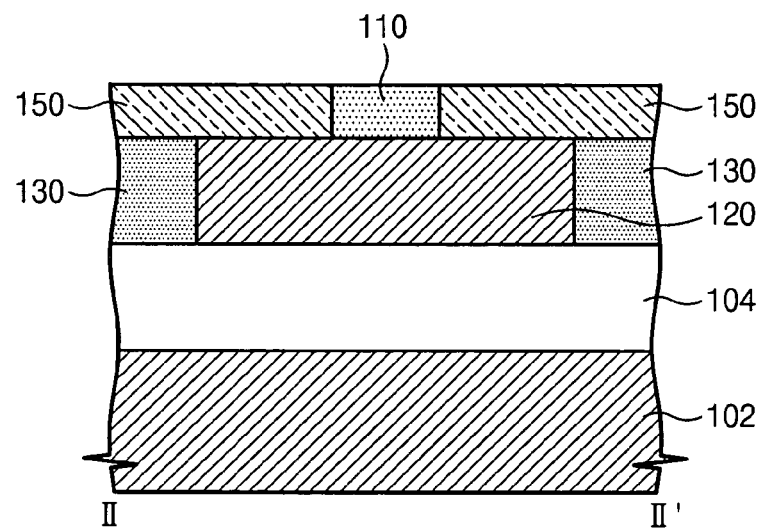

Referring to FIGS. 7A through 7C, the second mask pattern 140 may be removed to expose the first mask pattern 110, and a second sacrificial layer (not shown) may be formed on the resultant structure having the exposed first mask pattern 110. The second sacrificial layer may be planarized until a top surface of the first mask pattern 110 is exposed, and a second sacrificial pattern 150 may formed on sides, e.g., both sides, of the first mask pattern 110.

The second sacrificial layer may be planarized with, e.g., a CMP process using etch slurry having an etch selectivity with respect to the first mask pattern 110. As a result of the planarizing, the second sacrificial pattern 150 may have a top surface that is planar with the first mask pattern 110. The first mask pattern 110 may have, e.g., a tetragonal shape, and may be at least partially enclosed by the first sacrificial pattern 130 and the second sacrificial pattern 150.

The second sacrificial pattern 150 may be formed of at least one selected from the group consisting of a silicon oxide layer, a silicon nitride layer, a silicon oxynitride layer, and a polysilicon layer. In embodiments of the invention, the second sacrificial pattern 150 may be formed of a same material as the first sacrificial pattern 130.

Figure 8A:
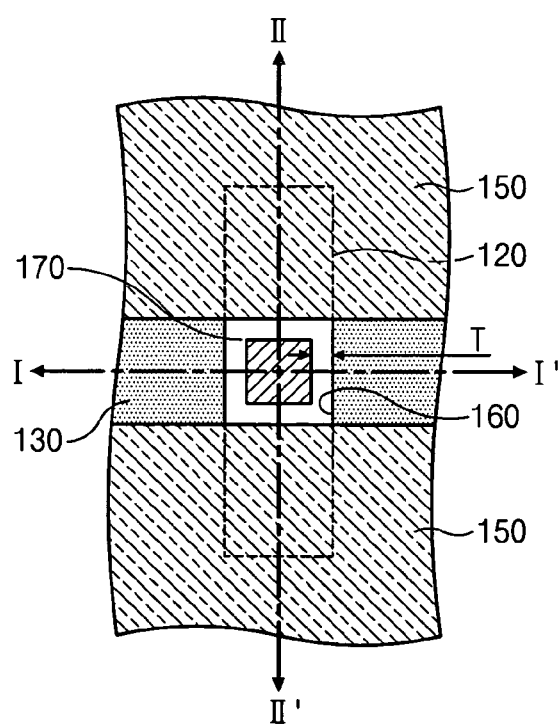
Figure 8B:
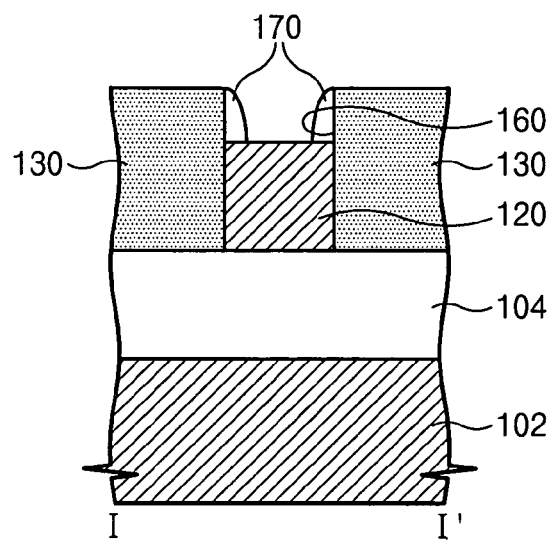
Figure 8C:
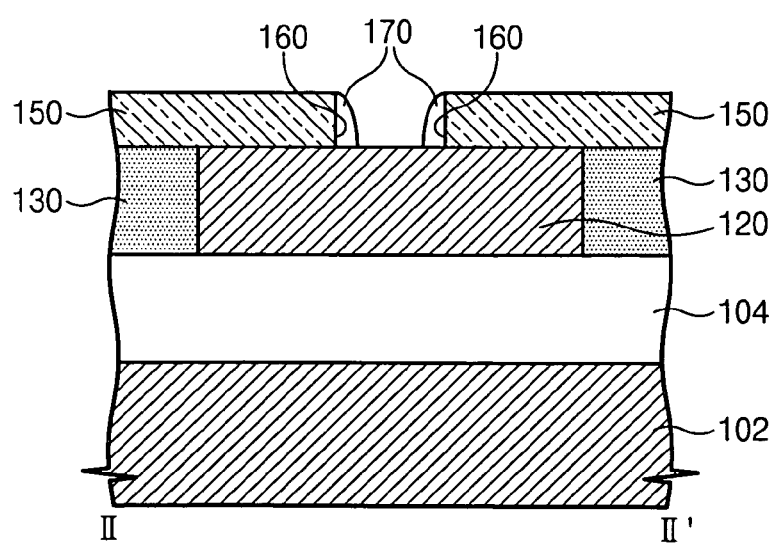

Referring to FIGS. 8A through 8C, the exposed first mask pattern 110 may be selectively removed using an etch recipe having an etch selectivity with respect to the first and second sacrificial patterns 130 and 150. As a result, an opening 160 may be formed corresponding to the removed first mask pattern 110, and the top surface 120a of the active pattern 120 may be exposed via the opening 160.

A spacer layer (not shown) may be conformably formed on the resultant structure having the opening 160. The spacer layer may be formed of a material having an etch selectivity with respect to the active pattern 120. For example, the spacer layer may include, e.g., a silicon oxide layer, a silicon nitride layer, a silicon oxynitride layer, and/or a polysilicon layer. Thereafter, the spacer layer may be anisotropically etched until the top surface 120a of the active pattern 120 is exposed, thereby forming a spacer 170 on an inner sidewall of the opening 160. For example, a central portion of the spacer layer may be anisotropically etched to form a spacer 170 having, e.g., a substantially rectangular-ring like shape. A thickness T of the spacer 170 may be a parameter that affects the shape of a channel of a transistor. Accordingly, it may be required for the thickness T of the spacer 170 to be precisely controlled. The spacer layer may be formed using, e.g., a chemical vapor deposition (CVD) or atomic layer deposition (ALD) technique. In embodiments of the invention, the thickness T of the spacer 170 may be uniform along the entire spacer.

Figure 9A:
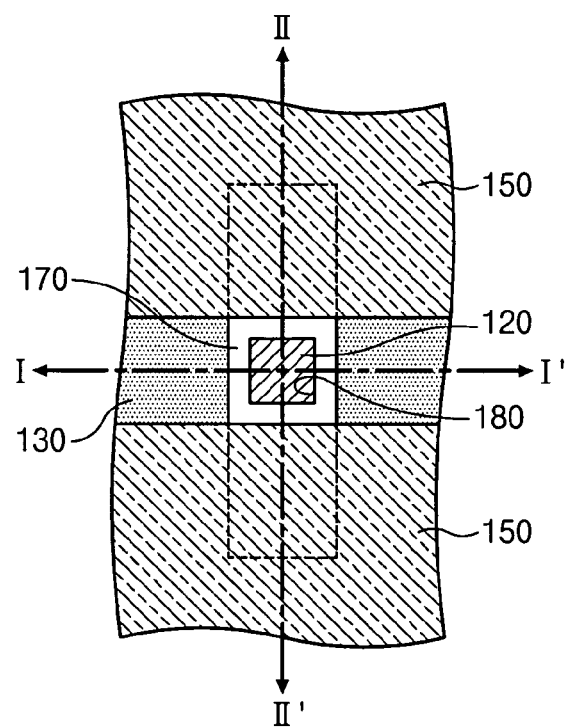
Figure 9B:
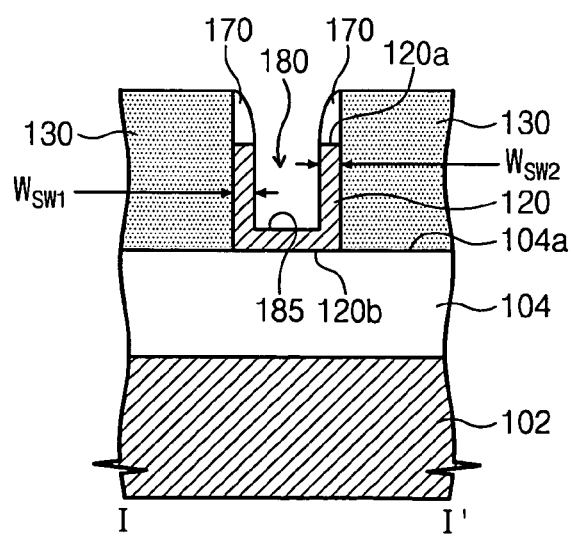
Figure 9C:
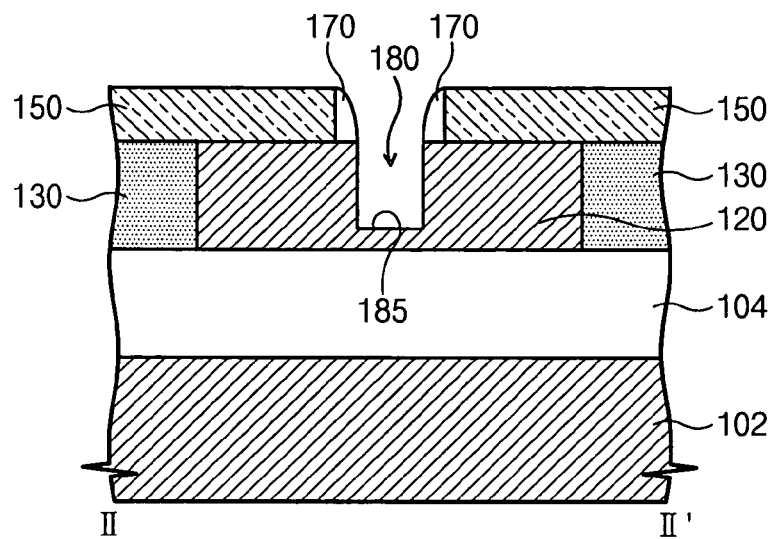

Referring to FIGS. 9A through 9C, the exposed top surface 120a of the active pattern 120 may be recessed using the spacer 170 as an etch mask. In embodiments of the invention where, e.g., the thickness T of the spacer 170 is uniform, the resulting sidewalls defining a groove region 180 may have substantially or exactly equal widths $W_{sw1}$, $W_{sw2}$. As a result of the recess process, the groove region 180 may be formed in the active pattern 120. In embodiments of the invention, a bottom surface 185 of the groove region 180 may be lower than the top surface 120a of the active pattern 120 and higher than the top surface 104a of the buried oxide layer 104. That is, the groove region 180 may be formed to such a depth as not to penetrate the active pattern 120.

In embodiments of the invention, the bottom surface 185 of the groove region 180 may serve as a channel region of the transistor. Thus, electrical characteristics of the transistor may be affected by a thickness of the bottom surface 185 of the groove region 180. Thus, the depth and/or thickness of the groove region 180 may be precisely controlled. In embodiments of the invention, during the recess process, the groove region 180 may be formed to have a depth of, e.g., about 5 nm to about 30 nm. The recess process may be performed on the active pattern 120 using, e.g., a dry etching process for a predetermined duration of time.

Figure 10A:
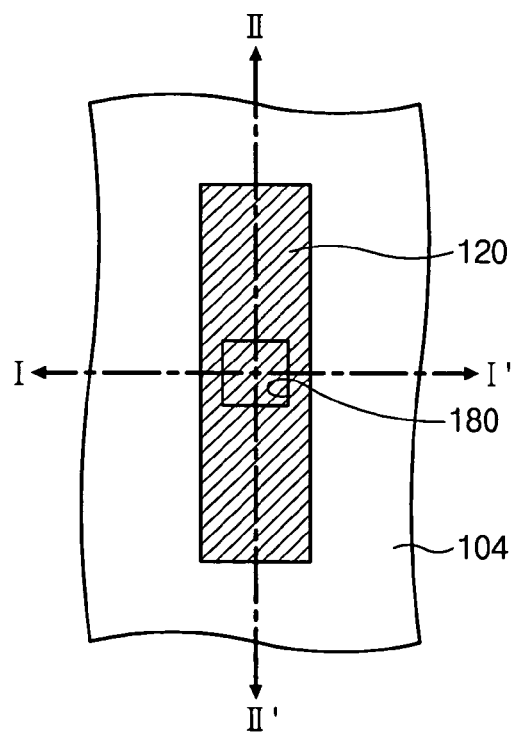
Figure 10B:
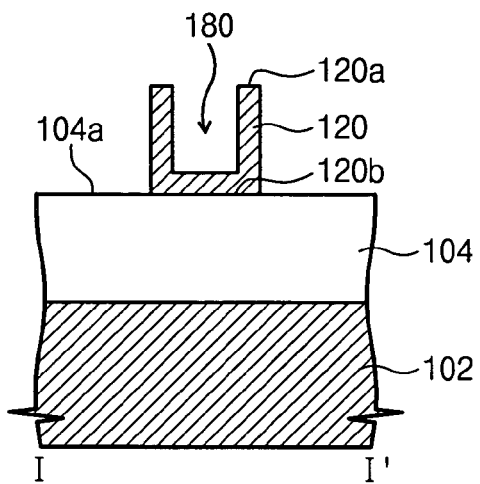
Figure 10C:
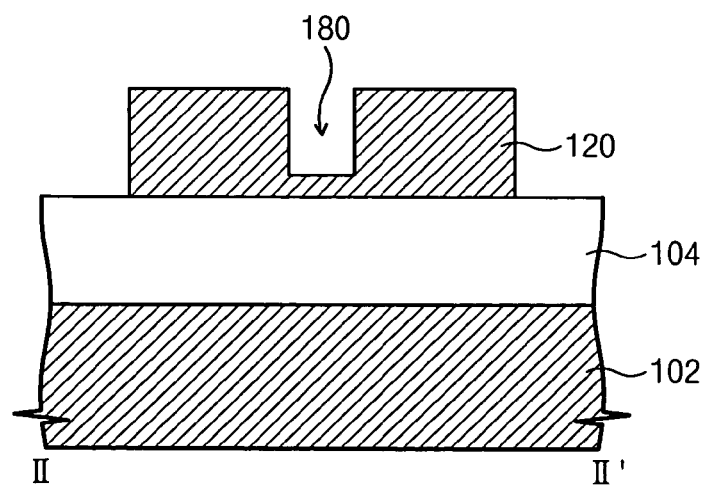

Referring to FIGS. 10A through 10C, the spacer 170 and the first and second sacrificial patterns 130 and 150 may be removed using an etch recipe having an etch selectivity with respect to the active pattern 120 and the buried oxide layer 104. To remove the spacer 170 and the first and second sacrificial patterns 130 and 150, several etching processes may be performed using, e.g., different etch recipes. As a result, the top surface 120a and sidewalls of the active pattern 120, including sidewalls of the active pattern 120 corresponding to the groove region 180, and the top surface 104a of the buried oxide layer 104 adjacent to the active pattern 120 may be exposed.

Figure 11A:
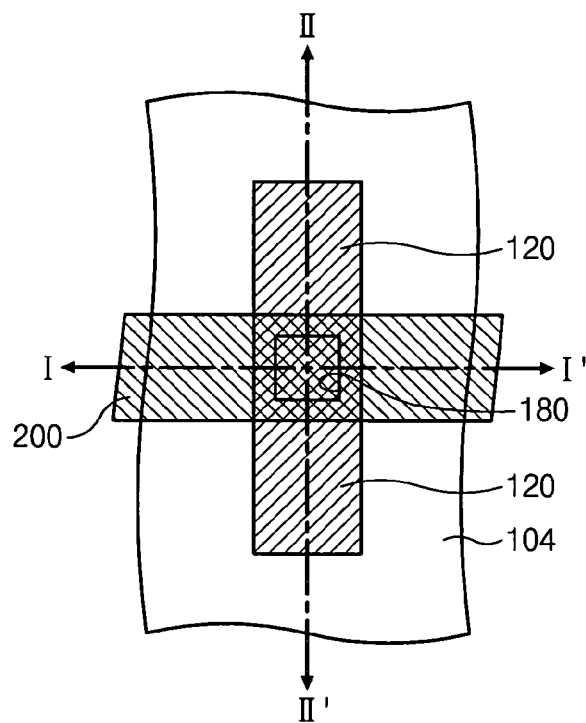
Figure 11B:
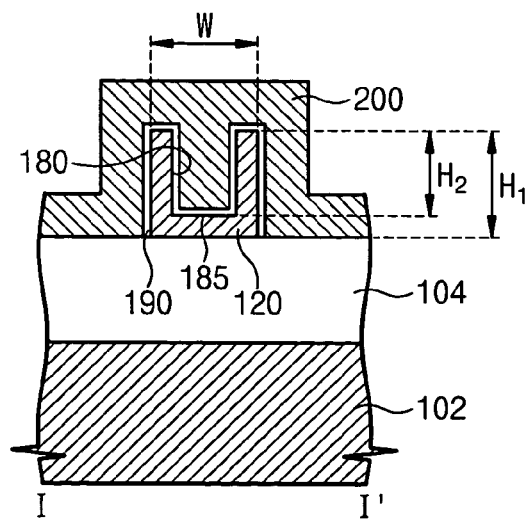
Figure 11C:
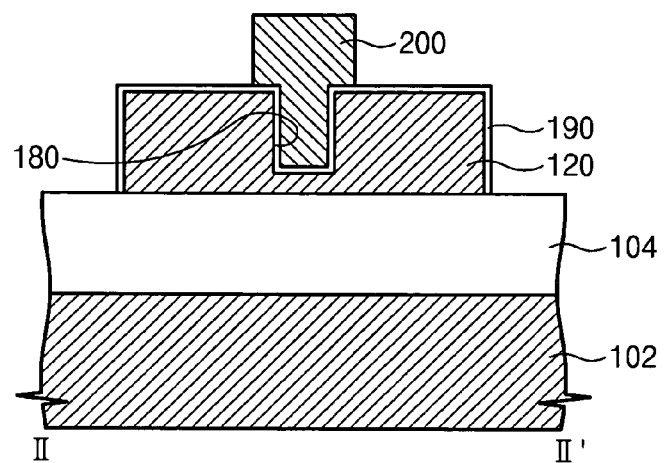

Referring to FIGS. 11A through 11C, a gate insulating layer 190 may be formed on one, some or all exposed surface(s) of the active pattern 120. Thus, the gate insulating layer 190 may also be formed on an inner wall of the groove region 180. A gate pattern 200 may then be formed on the lower semiconductor layer 102. More particularly, the gate pattern 200 may be formed on, e.g., the gate insulating layer 190 and the buried oxide layer 104. For example, the gate pattern 200 may be formed on the gate insulating layer 190 along the bottom surface 185 and the sidewalls of the groove region 180. In such cases, the gate pattern 200 may fill the groove region 180 in which the gate insulating layer 190 may be formed.

In some embodiments of the invention, the gate insulating layer 190 may be, e.g., a silicon oxide layer that is obtained by thermally oxidizing the exposed active pattern 120. In some embodiments of the invention, the gate insulating layer 190 may be a high-k dielectric layer, e.g., an aluminum oxide layer or a hafnium oxide layer. The formation of the gate pattern 200 may include forming a gate conductive layer (not shown) on the resultant structure with the gate insulating layer 190 and patterning the gate conductive layer. Patterning of the gate conductive layer may be performed using, e.g., the reticle for the gate pattern, which as described above, may also be used to form the second mask pattern 140. The gate pattern 200 may include a polysilicon layer, a silicide layer, and/or a tungsten layer.

Figure 12:
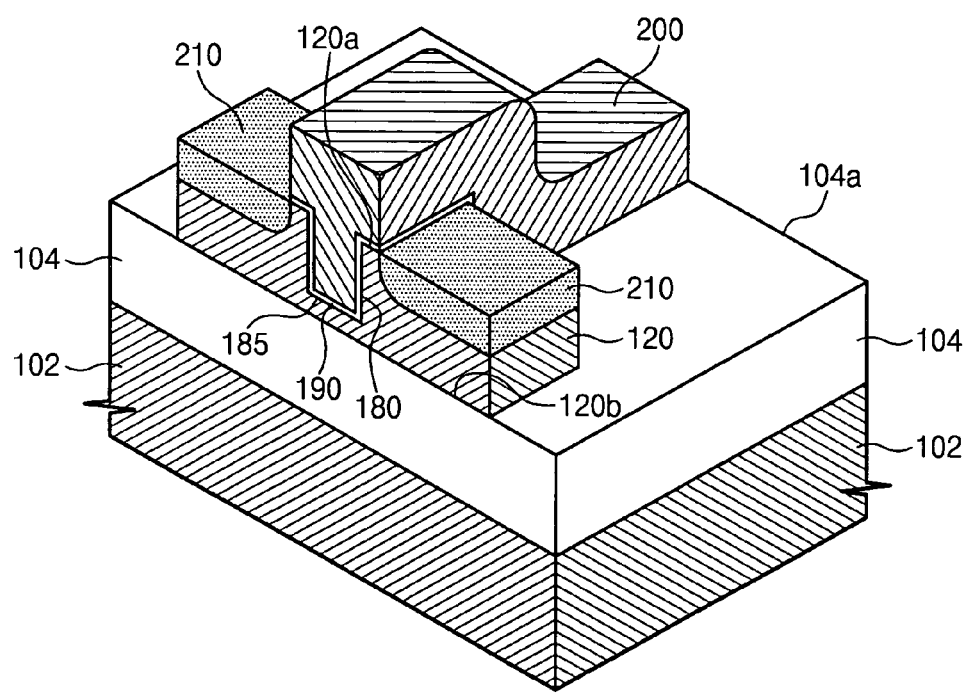
FIG. 12 illustrates a perspective view of a portion of a transistor structure of a semiconductor device according to one or more aspects of the invention.

FIG. 12 illustrates a perspective view of a portion of a transistor structure of a semiconductor device according to one or more aspects of the invention. The exemplary embodiment illustrated in FIG. 12 may be formed using various embodiments of the invention, e.g., the first, second and third exemplary embodiments of the invention described herein.

Referring to FIG. 12, an active pattern 120 may be arranged on a substrate including, e.g., a lower semiconductor layer 102 and a buried oxide layer 104 that may be sequentially stacked. A groove region 180 may be formed in the active pattern 120. The bottom surface 185 of the groove region 180 may be lower than the top surface 120a of the active pattern 120 and higher than a lower surface 120b of the active pattern 120. In the exemplary embodiment illustrated in FIG. 12, the groove region 180 is illustrated at a central portion of the active region 120. However, embodiments of the invention are not limited to the groove region 180 being formed at the central region of the active region 120, and may be formed at other portions of the active region 120.

The active pattern 120 may include, e.g., monocrystalline silicon or other semiconductor materials. The lower semiconductor layer 102 may include, e.g., monocrystalline silicon or other semiconductor materials. Thus, in embodiments of the invention, the active pattern 120 and the lower semiconductor layer 102 may be formed of a same material. Further, the buried oxide layer 104 may be formed of silicon oxide or other insulating materials.

A gate pattern 200 may be disposed on the active pattern 120 and may extend along the groove region 180. That is, the gate pattern 200 may extend along the bottom surface 185 and inner sidewalls of the groove region 180. A gate insulating layer 190 may be disposed between the gate pattern 200 and the active pattern 120. The gate pattern 200 may include, e.g., a polysilicon layer, a silicide layer, and/or a tungsten layer. The gate insulating layer 190 may include, e.g., a silicon oxide layer, an aluminum oxide layer, and/or a hafnium oxide layer. The gate pattern 200 may be disposed over the gate insulating layer 190 and may fill the groove region 180. In embodiments of the invention, the gate pattern 200 may partially cover an outer sidewall and the top surface 120a of the active pattern 120 and may completely cover the bottom surface 185 and the inner side walls of the groove region 180.

Impurity regions 210 for source and drain electrodes of a transistor may be formed in portions of the active pattern 120 that are not covered with the gate pattern 200. A portion of the active region 120 under the gate pattern 200 may serve as a channel region of the transistor. A length of the channel region may correspond a width of the gate pattern 200, which may be equal to a length of a region of the active pattern 120 covered with the gate pattern 200. For example, referring to FIG. 11B, assuming that a width and a thickness of the active pattern 120 are W and $H_1$, respectively, and a depth of the groove region 180 is $H_2$, a width of the channel region is $W+2(H_1+H_2)$. Thus, when the width of the active pattern 120 is varied, the width of the channel region of the transistor is also varied. In contrast to the multi-channel FET, which, as discussed above, may be limited to discrete channel widths, embodiments of the invention provide transistors that are not limited to discrete channel widths.

Figure 13A:
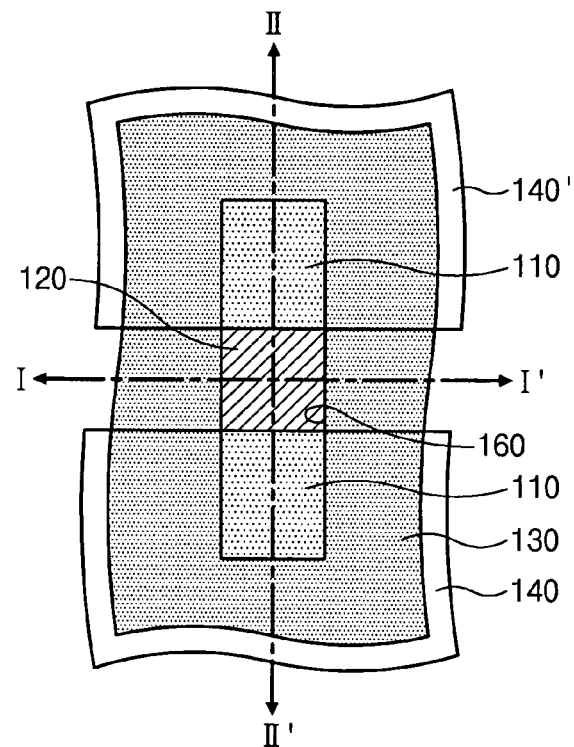
FIGS. 13A and 14A illustrate plan views of resulting structures formed during stages of a second exemplary embodiment of a method of fabricating a transistor of a semiconductor device according to one or more aspects of the invention.
Figure 13B:
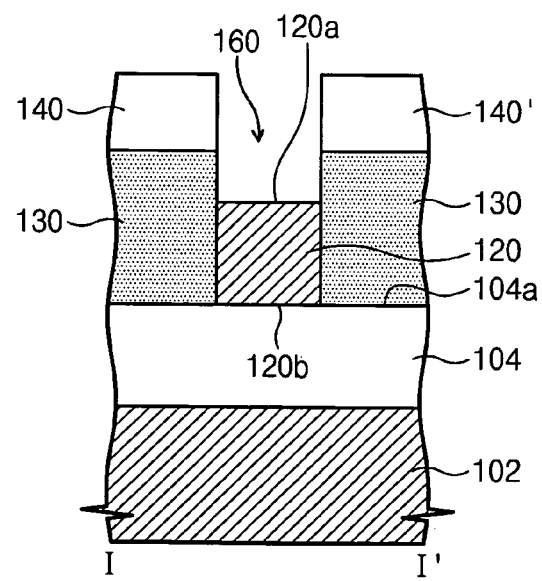
FIGS. 13B and 14B illustrate cross sectional views of the corresponding resulting structures illustrated in FIGS. 13A and 14A, respectively, taken along line I-I' of FIGS. 13A and 14A.
Figure 13C:
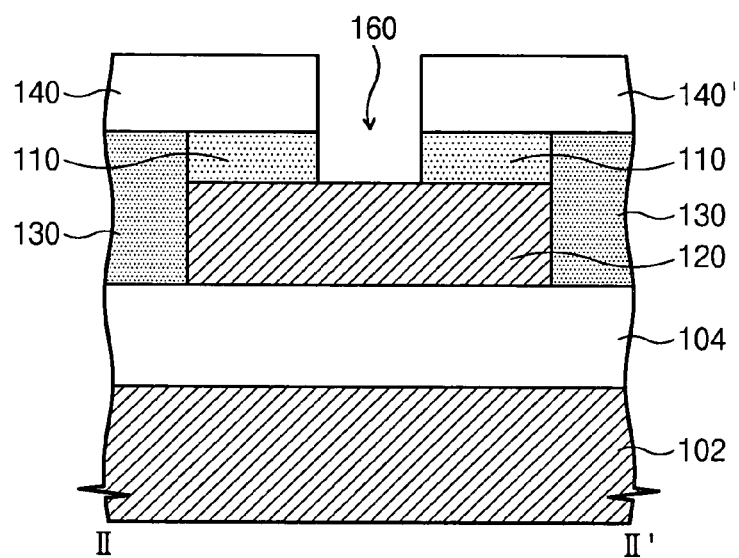
FIGS. 13C and 14C illustrate cross sectional views of the corresponding resulting structures illustrated in FIGS. 13A and 14A, respectively, taken along line II-II' of FIGS. 13A and 14A.
Figure 14A:
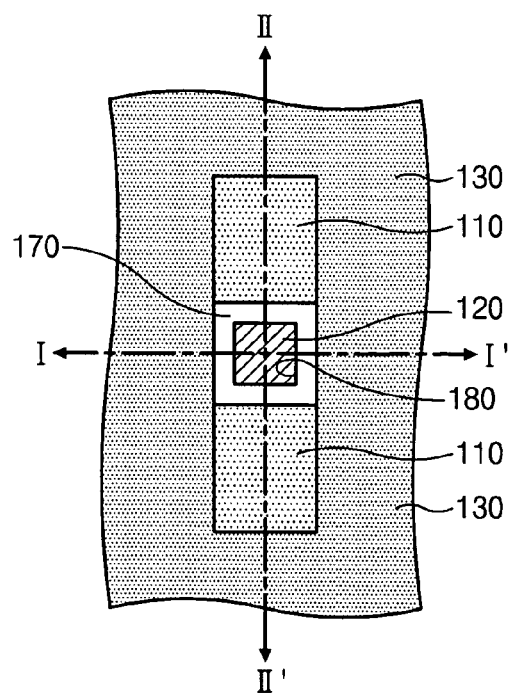
Figure 14B:
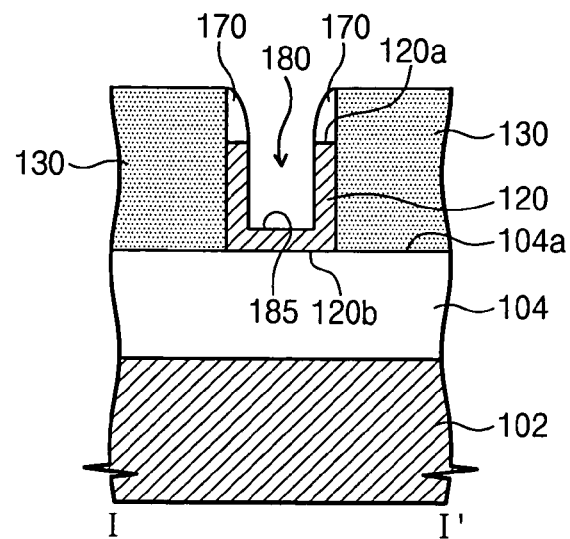
Figure 14C:
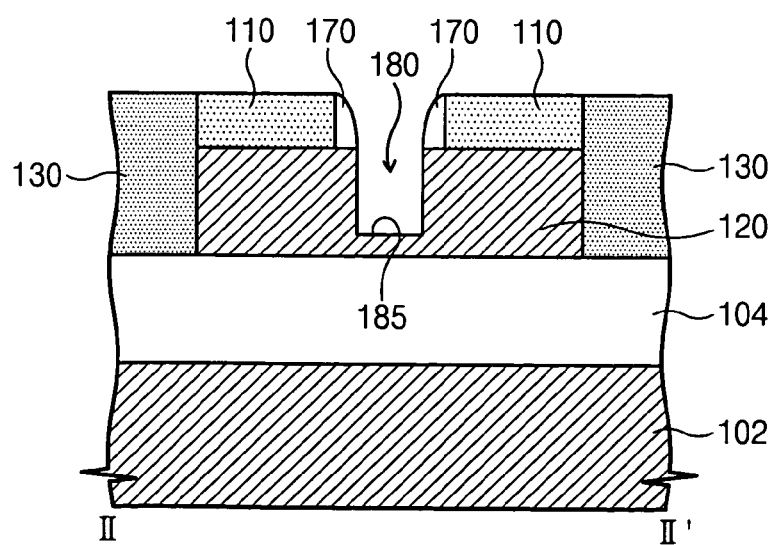

FIGS. 13A and 14A illustrate plan views of resulting structures formed during stages of a second exemplary embodiment of a method of fabricating a transistor of a semiconductor device according to one or more aspects of the invention; FIGS. 13B and 14B illustrate cross sectional views of the corresponding resulting structures illustrated in FIGS. 13A and 14A, respectively, taken along line I-I' of FIGS. 13A and 14A; and FIGS. 13C and 14C illustrate cross sectional views of the corresponding resulting structures illustrated in FIGS. 13A and 14A, respectively, taken along line II-II' of FIGS. 13A and 14A.

In general, only differences between the present exemplary embodiment and the first exemplary described with reference to FIGS. 3A-11C will be described below. The present exemplary embodiment substantially corresponds to the first exemplary embodiment, except for a process of forming an opening.

Referring to FIGS. 13A through 13C, a second mask pattern 140', exposing a predetermined region of the first mask pattern 110, may be formed on the same resultant structure having the first sacrificial pattern 130, as described above with reference to FIGS. 5A through 5C. The second mask pattern 140' may be, e.g., a photoresist pattern obtained using, e.g., a photolithography process. A channel region of a transistor may be formed by exposing the second mask pattern 140' during a subsequent process.

The first mask pattern 110 may then be etched using the second mask pattern 140' as an etch mask until the top surface 120a of the active pattern 120 is exposed. The etching of the first mask pattern 110 may be performed through, e.g., an anisotropic etching process using an etch recipe having an etch selectivity with respect to the first sacrificial pattern 130 and the active pattern 120. As a result, the opening 160 may be formed in the first mask pattern 110, and the opening 160 may expose the top surface 120a of the active pattern 120.

Referring to FIGS. 14A through 14C, the second mask pattern 140' may be removed to expose the first sacrificial pattern 130 and the first mask pattern 110. As described above with reference to the first exemplary embodiment, the spacer 170 may be formed on the inner sidewall of the opening 160. Next, the exposed top surface 120a of the active pattern 120 may be recessed using, e.g., the spacer 170 as an etch mask. Through the recess process, the groove region 180 may be formed in the active pattern 120. In embodiments of the invention, the bottom surface 185 of the groove region 180 may be lower than the top surface 120a of the active pattern 120. and higher than the top surface 104a of the buried oxide layer 104 and/or the lower surface 120b of the active pattern 120. That is, the groove region 180 may be formed to such a depth that the groove region 180 may not fully penetrate through the active pattern 120. Processes following forming the groove region 180 may correspond to the processes of the first embodiment, thus a description thereof will not be presented here.

Figure 15A:
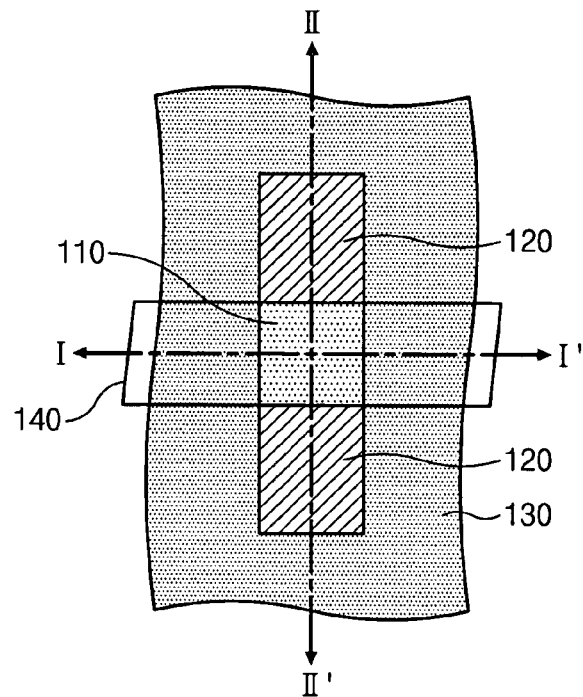
FIGS. 15A and 16A illustrate plan views of resulting structures formed during stages of a third exemplary embodiment of a method of fabricating a transistor of a semiconductor device according to one or more aspects of the invention.
Figure 15B:
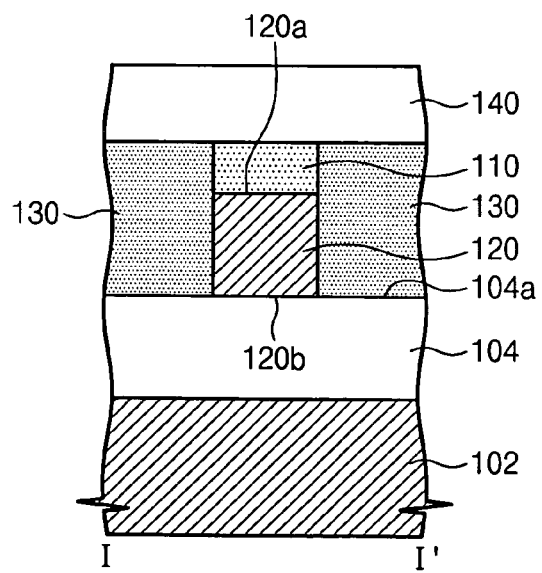
FIGS. 15B and 16B illustrate cross sectional views of the corresponding resulting structures illustrated in FIGS. 15A and 16A, respectively, taken along line I-I' of FIGS. 15A and 16A.
Figure 15C:
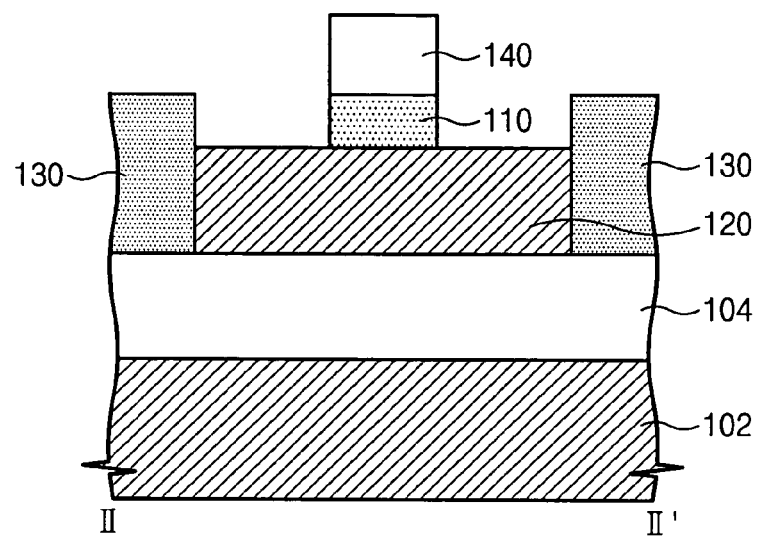
FIGS. 15C and 16C illustrate cross sectional views of the corresponding resulting structures illustrated in FIGS. 15A and 16A, respectively, taken along a dotted line II-II' of FIGS. 15A and 16A.
Figure 16A:
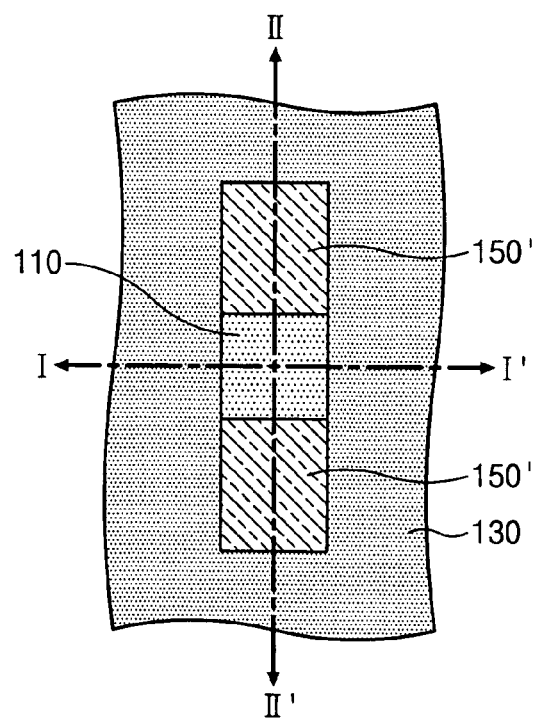
Figure 16B:
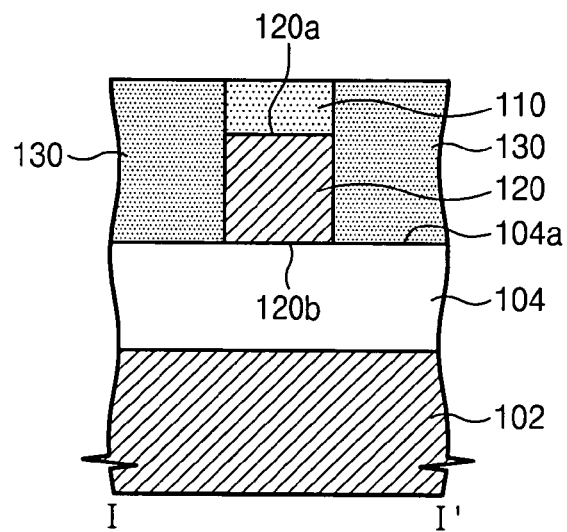
Figure 16C:
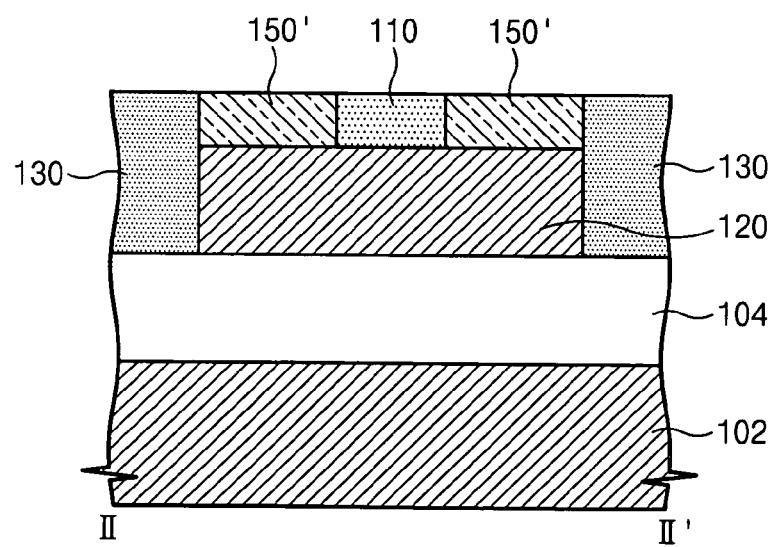

FIGS. 15A and 16A illustrate plan views of resulting structures formed during stages of a third exemplary embodiment of a method of fabricating a transistor of a semiconductor device according to one or more aspects of the invention; FIGS. 15B and 16B illustrate cross sectional views of the corresponding resulting structures illustrated in FIGS. 15A and 16A, respectively, taken along line I-I' of FIGS. 15A and 16A; and FIGS. 15C and 16C illustrate cross sectional views of the corresponding resulting structures illustrated in FIGS. 15A and 16A, respectively, taken along a dotted line II-II' of FIGS. 15A and 16A. In general, only differences between the present exemplary embodiment and the first exemplary described with reference to FIGS. 3A-11C will be described below. The present exemplary embodiment substantially corresponds to the first exemplary embodiment, except for a process of forming an opening.

Referring to FIGS. 15A through 15C, a second mask pattern 140 may be formed across the first mask pattern 110 on the resultant structure having the first sacrificial pattern 130. In the present embodiment, the second mask pattern 140 may be formed in the same manner as described above with reference to FIGS. 6A through 6C.

Thereafter, in embodiments of the invention, the first mask pattern 110 may be selectively etched using the second mask pattern 140 as an etch mask until the top surface 120a of the active pattern 120 is exposed. The etching of the first mask pattern 110 may be performed through, e.g., an anisotropic etching process using an etch recipe having an etch selectivity with respect to the first sacrificial pattern 130 and the active pattern 120. As a result, the top surface 120a of the active pattern 120 may be exposed on both sides of the second mask pattern 110.

Referring to FIGS. 16A through 16C, the second mask pattern 140 may then be removed, and a second sacrificial pattern 150' may be formed to fill the exposed top portion of the active pattern 120. The second sacrificial pattern 150' may be formed in the same manner as described above with reference to FIGS. 7A through 7C. Processes after forming the second sacrificial pattern 150 may correspond to the processes of the first embodiment (refer to FIGS. 8A through 8C), thus a description thereof will not be presented here.

Embodiments of the invention provide a gate pattern formed on the active pattern that includes a groove region. In embodiments of the invention, by forming a groove region that does not penetrate the active pattern, a bottom surface of the groove region can be used as the channel region of the transistor. As a result, embodiments of the invention enable a width of the channel region can be controlled by increasing the width of the active pattern and/or expanding the width of the groove region.

In embodiments of the invention, owing to the construction of the invention, the technical restrictions of a conventional multi-channel FET with a discrete channel width can be overcome, and a rise in current dispersion of a transistor caused by the shrinkage of a mask pattern can be prevented and/or reduced during the fabrication of a FIN-FET. Furthermore, a transistor structure according to the invention may have the foregoing 3-dimensional active pattern and may overcome the technical problems of a planar MOS transistor, such as a short channel effect and a drop in current driving capability.

It will be apparent to those skilled in the art that various modifications and variations can be made in the invention. Thus, it is intended that the invention covers the modifications and variations of this invention provided they come within the scope of the appended claims and their equivalents.

What is claimed is:

1. A transistor for a semiconductor device, comprising:
   a lower semiconductor layer;
   an active pattern on the lower semiconductor layer, the active pattern including a groove region, outer sidewalls defining a width of the active pattern, inner sidewalls defining the groove region between the outer sidewalls and top surfaces, each of the top surfaces extending between respective ones of the outer sidewalls and the inner sidewalls;
   a gate pattern at least partially overlapping the active pattern including the groove region; and
   a gate insulating layer interposed between the active pattern and the gate pattern,
   wherein the outer sidewalls, the inner sidewalls and the top surfaces of the active pattern and a bottom surface of the groove region face the gate pattern, corresponding to a channel region of the transistor, and the bottom surface of the groove region is lower than the top surfaces of the active pattern and higher than a lower surface of the active pattern.

2. The transistor as claimed in claim 1, wherein the groove region is formed in a central portion of the active pattern,
   wherein two of the outer sidewalls defining the width of the active pattern, which are disposed under the gate pattern and define the groove region, have a same width.

3. The transistor as claimed in claim 1, wherein the active pattern includes monocrystalline silicon.

4. The transistor as claimed in claim 1, further comprising an insulating layer interposed between the active pattern and the lower semiconductor layer.

5. The transistor as claimed in claim 1, wherein the gate pattern partially covers the top surfaces of the active pattern and completely covers the outer sidewalls defining the width of the active pattern and the bottom surface and an inner side wall of the groove region.

6. The transistor as claimed in claim 1, wherein a width of a channel region defined by the gate pattern and the active pattern is $W+2(H_1+H_2)$, wherein W is a width of the active pattern, $H_1$ is a thickness of the active pattern, and $H_2$ is a depth of the groove region.

* * * * *